(12) United States Patent
Yoshida et al.

(10) Patent No.: US 7,009,446 B2
(45) Date of Patent: Mar. 7, 2006

(54) ACTIVE FILTER CIRCUIT WITH REDUCED NOISE

(75) Inventors: Yoshikazu Yoshida, Hyogo (JP); Akira Yoshida, Chiba (JP)

(73) Assignee: Oki Electric Industry Co.. Ltd., Tokyo (JP)

( * ) Notice: Subject to any disclaimer, the term of this patent is extended or adjusted under 35 U.S.C. 154(b) by 0 days.

(21) Appl. No.: 09/860,457

(22) Filed: May 21, 2001

(65) Prior Publication Data
US 2001/0048342 A1    Dec. 6, 2001

(51) Int. Cl.
H03B 1/00    (2006.01)

(52) U.S. Cl. ..................... 327/552; 330/303

(58) Field of Classification Search ........ 327/552–554, 327/555–559, 561; 330/98, 303, 306, 310, 330/311; 333/215, 166, 167, 173, 165
See application file for complete search history.

(56) References Cited

U.S. PATENT DOCUMENTS 4,823,092 A * 4/1989 Pennock ..................... 330/253
5,384,501 A * 1/1995 Koyama et al. ............ 327/336
5,625,317 A * 4/1997 Deveirman .................. 327/552

FOREIGN PATENT DOCUMENTS

| JP | 06-120772 | 4/1994 |
|----|-----------|--------|
| JP | 06-164314 | 6/1994 |
| JP | 11-004139 | 1/1999 |

* cited by examiner

*Primary Examiner*—Minh Nguyen
(74) *Attorney, Agent, or Firm*—Rabin & Berdo, PC

(57) ABSTRACT

Input conversion noises of a filter circuit are reduced. The circuit has plural circuit arrangements obtained by dividing the filter circuit so as to include at least one voltage controlled current source, and at least one circuit arrangement is an amplification circuit having an amplifying function for amplifying an input signal to the filter circuit at a set amplification factor. The amplification element circuit has: a loop circuit constructed by plural intra-loop voltage controlled current sources in which mutual conductance values have a predetermined corresponding relation; and a corresponding capacitor connected to a node in the loop circuit and having a capacitance depending on the corresponding relation so as to set a potential at the node to a predetermined potential corresponding to the amplification factor, and amplification element circuit has an electric nature which is independent of the amplification factor when seeing from the input side of the filter circuit.

9 Claims, 8 Drawing Sheets

ACTIVE FILTER CIRCUIT WITH REDUCED NOISE

BACKGROUND OF THE INVENTION

1. Field of the Invention

The invention relates to a filter circuit which is suitable when it is applied to, for example, an integrated circuit or the like.

2. Related Background Art

There are the following reference literatures 1 to 3 as literatures describing conventional analog filter circuits.

Reference literature 1: JP-A-6-120772
Reference literature 2: JP-A-6-164314
Reference literature 3: JP-A-11-004139

Among them, it is an object of the reference literature 1 to provide an active filter in which an amplitude range of an input signal is widened while suppressing an increase in current consumption.

It is an object of an active filter circuit of the reference literature 2 to improve an S/N ratio of the filter circuit and suppress input conversion noises.

It is an object of an active filter circuit of the reference literature 3 that, in a filter circuit of the LC ladder type constructed by a voltage controlled current source and a plurality of capacitors and with resistances terminating both ends of the ladder, the occurrence of an unnecessary time constant due to a parasitic capacitance which is formed at a node of a circuit for performing the terminating resistance operation and a circuit for performing the serial reactance operation is prevented, thereby obtaining good filter characteristics.

The following methods are considered on the basis of the contents of the reference literatures 1 to 3.

In case of forming an integrated circuit (IC) of a filter circuit of the LC ladder type with resistances terminating both ends as shown in FIG. 5, since it is difficult to construct an inductor into the IC, generally, the formation of the IC is realized by replacing the inductor with a voltage controlled current source and a capacitor. By also replacing a terminal resistor with the same device as the voltage controlled current source, a filter circuit using no resistor can be constructed.

The reason why such a replacement is performed is as follows. That is, the resistors are generally formed with variations in temperature characteristics and device values upon manufacturing of the ICs and, after the ICs were once manufactured, it is impossible to adjust the variations in the temperature characteristics and device values. On the other hand, according to the voltage controlled current source with an adjusting terminal, even after the IC was manufactured, a mutual conductance can be adjusted by using the adjusting terminal. There is, consequently, a large advantage such that even if there are variations in the temperature characteristics and device values, the characteristics of the filter circuit can be maintained.

Generally, with respect to the voltage controlled current source, the following equation is satisfied from a relation between an input voltage Vin and an output current Iout as shown in FIG. 8.

$$Iout = Vin \times gm \quad (1)$$

gm: mutual conductance of the voltage controlled current source

For example, a case where a low pass filter circuit of the dual resistance terminating LC ladder type of the ternary π type shown in FIG. 5 is constructed by a voltage controlled current source and a capacitor will now be considered. However, it is assumed that two terminal resistors R11 and R12 have the same resistance value.

FIG. 9 is an explanatory diagram of a circuit obtained by replacing a parallel resistor circuit with a voltage controlled current source. In FIG. 9, the following equation is satisfied from the relation between an input voltage Vr and an input current Ir.

$$Ir = Vr/R$$

$$-Ir = Vr \times (-gm)$$

$$\therefore gm = 1/R \quad (2)$$

FIG. 10 is an explanatory diagram of a circuit obtained by replacing a parallel inductor circuit with a voltage controlled current source and a capacitor. In FIG. 10, the following equations are satisfied from the relation between an input voltage V1 and an input current I1.

$$Z1 = Ls$$

$$Zc = 1/Cs$$

$$I1 = V1/Z1 = V1/Ls$$

$$Ia = V1 \times gm$$

$$Ib = Ia \times Zc \times (-gm) = -Ia \times gm/Cs$$

$$I1 = -Ib = Ia \times gm/Cs = V1 \times gm^2/Cs$$

$$\therefore C = L \times gm^2 \quad (3)$$

where,
Ls, Cs: transfer function expressions of an inductance L and a capacitance C
s: frequency obtained by more generalizing a frequency f and $s = j \times 2\pi f$
Zc: impedance of the capacitor C
^2: square of a just-previous character FIG. 11 is an explanatory diagram of a circuit obtained by replacing a serial inductor circuit with a voltage controlled current source and a capacitor. As for the serial inductor circuit, it is sufficient that the parallel inductor circuit of two terminals shown in FIG. 10 is converted into a circuit of four terminals.

In FIG. 5, to convert the terminal resistor R11 on the input side into a parallel resistor, an input signal is converted from a voltage into a current, so that a circuit shown in FIG. 6 is obtained. Therefore, if the low pass filter circuit shown in FIG. 5 is constructed by a voltage controlled current source and a capacitor by using the parallel resistor circuit and the serial inductor circuit mentioned above, a circuit as shown in FIG. 7 is obtained. An input terminating portion 71 corresponds to R11 in FIG. 5, an inductor portion 72 corresponds to L11, and an output terminating portion 73 corresponds to R12.

Generally, since any devices (active device and passive device) generate noises, in the circuit obtained as a result of the above replacement, the voltage controlled current source itself can become a main noise source. Although various factors are considered as noises, for simplicity of explanation, it is assumed that the following relational equation is satisfied in output noises Ni of the voltage controlled current source whose mutual conductance is equal to gm.

$$Ni = 4 \times k \times T \times dF/gm \quad (4)$$

where, k: Boltzmann's constant

T: absolute temperature dF: frequency band width

Since all mutual conductances of voltage controlled current sources in a filter circuit 70 in FIG. 7 are equal, output noises N7 in the filter circuit 70 are expressed by the following equation.

$$N7=\sqrt{(7 \times Ni^2)}=\sqrt{7} \times Ni=2.65 \times Ni \quad (5)$$

It is now assumed that all of the voltage controlled current sources in the filter circuit 70 uniformly exert an influence on the output noises N7. Therefore, the value of N7 does not depend on a connection of the filter circuit 70 but depends only on the number of voltage controlled current sources existing in the filter circuit 70.

Although it is effective to allow an input and an output of the filter circuit to have a gain in order to improve input conversion noises in the filter circuit, in the filter circuit with a construction as shown in FIG. 7, an input signal does not have a gain. Even if an amplifying circuit is connected to the post stage of such a filter circuit in order to allow the input signal to have a gain, not only a signal of a frequency component in a band where the filter circuit passes but also noises which are generated by the filter circuit are amplified by an amount corresponding to the same gain, so that there is not an effect of improving the input conversion noises.

SUMMARY OF THE INVENTION

It is an object of the invention to provide an active filter circuit which can reduce input conversion noises without causing a change in frequency band characteristics.

To accomplish the above object, according to the first aspect of the invention, there is provided a filter circuit having a plurality of voltage controlled current sources, comprising (1) a plurality of element circuits which are obtained by dividing the filter circuit so as to include at least one of the voltage controlled current sources, wherein (2) at least one of the plurality of element circuits is an amplification element circuit having an amplifying function for amplifying an input signal to the filter circuit at a set amplification factor, (3) the amplification element circuit comprises a loop circuit constructed by a plurality of intra-loop voltage controlled current sources in which values of mutual conductances are set to a predetermined corresponding relation and a corresponding capacitor which is connected to a contact in the loop circuit and has a capacitance value depending on the corresponding relation so as to set an electric potential at the contact to a predetermined electric potential corresponding to the amplification factor, and (4) the amplification element circuit has an electric nature which does not depend on the amplification factor when it is seen from an input side of the filter circuit.

According to the second aspect of the invention, in the filter circuit of the first aspect, the loop circuit is constructed by two intra-loop voltage controlled current sources, one of values of mutual conductances which the two intra-loop voltage controlled current sources have is set to a value that is M (M is a positive real number excluding 1) times as large as a reference value, and the other is set to a value that is 1/M time as large as the reference value, and the amplification factor is set to M.

According to the third aspect of the invention, in the filter circuit of the second aspect, one of the values of the mutual conductances of the two voltage controlled current sources is set to a value that is M times as large as a predetermined value which will give a gain "1" to the filter circuit, and the other is set to a value that is 1/M time as large as the predetermined value.

According to the fourth aspect of the invention, in the filter circuit of the second aspect, a loop circuit of an amplification factor N (N is a positive real number excluding 1) is provided in the filter circuit together with the loop circuit of the amplification factor M, thereby setting an amplification factor of the whole filter circuit to a product of N and M.

According to the fifth aspect of the invention, in the filter circuit of the first aspect, in the amplification element circuit, one or a plurality of output side contacts and one or a plurality of corresponding capacitors connected to the output side contacts are provided on an output terminal side of the filter circuit, a reference loop circuit corresponding to the loop circuit has a first intra-reference-loop voltage controlled current source whose self output terminal is connected to the contact and a second intra-reference-loop voltage controlled current source whose self input terminal is connected to the contact, a value of a mutual conductance which the second intra-reference-loop voltage controlled current source has is set to a value that is 1/L time as large as a reference value (L is a positive real number excluding 1), a value of a mutual conductance which the first intra-reference-loop voltage controlled current source has is set to the reference value, capacitance values of all of the corresponding capacitors connected to the contact and the output side contacts are set to values each of which is 1/L time as large as a reference value, and further, values of mutual conductances which all of the voltage controlled current sources whose input terminals and/or output terminals are connected to the output side contacts have are set to the value that is 1/L time as large as the reference value, thereby setting an amplification factor as a whole filter circuit to L.

According to the sixth aspect of the invention, in the filter circuit of the fifth aspect, as a loop circuit, besides the reference loop circuit, an output side loop circuit arranged on an output terminal side of the filter circuit at a position nearer than the reference loop circuit is provided, the output side loop circuit has a first output side intra-loop voltage controlled current source whose self output terminal is connected to the output side contact and a second output side intra-loop voltage controlled current source whose self input terminal is connected to the output side contact, a value of a mutual conductance which the second output side intra-loop voltage controlled current source has is set to a value that is 1/P time as large as a reference value (P is a positive real number excluding 1), a value of a mutual conductance which the first output side intra-loop voltage controlled current source has is set to the value that is 1/P time as large as the reference value, capacitance values of all of the corresponding capacitors connected to the output side contacts are set to values each of which is 1/P time as large as a reference value, and further, values of mutual conductances which all of the voltage controlled current sources whose input terminals and/or output terminals are connected to the output side contacts have are set to the value that is 1/P time as large as the reference value, thereby setting an amplification factor as a whole filter circuit to L×P.

According to the seventh aspect of the invention, in the filter circuit of any one of the first to sixth aspects, the filter circuit further comprises: a linear voltage controlled current source which sets the contact in the amplification element circuit to a reference, is connected to a contact on an input terminal side of the filter circuit at a position nearer than such a reference contact, and executes the linear operation;

and a non-linear voltage controlled current source which is connected to a contact on an output terminal side of the filter circuit at a position nearer than such a reference contact and executes the non-linear operation, and the filter circuit also functions as a limiter.

The above and other objects and features of the present invention will become apparent from the following detailed description and the appended claims with reference to the accompanying drawings.

DETAILED DESCRIPTION OF THE PREFERRED EMBODIMENTS (A) Embodiments

The first to fourth embodiments with respect to a case where a filter circuit of the invention is applied to a low pass filter will now be described as examples hereinbelow.

The first embodiment relates to a filter circuit of an LC ladder type of a ternary π type.

(A-1) Construction of the First Embodiment

Figure 1:
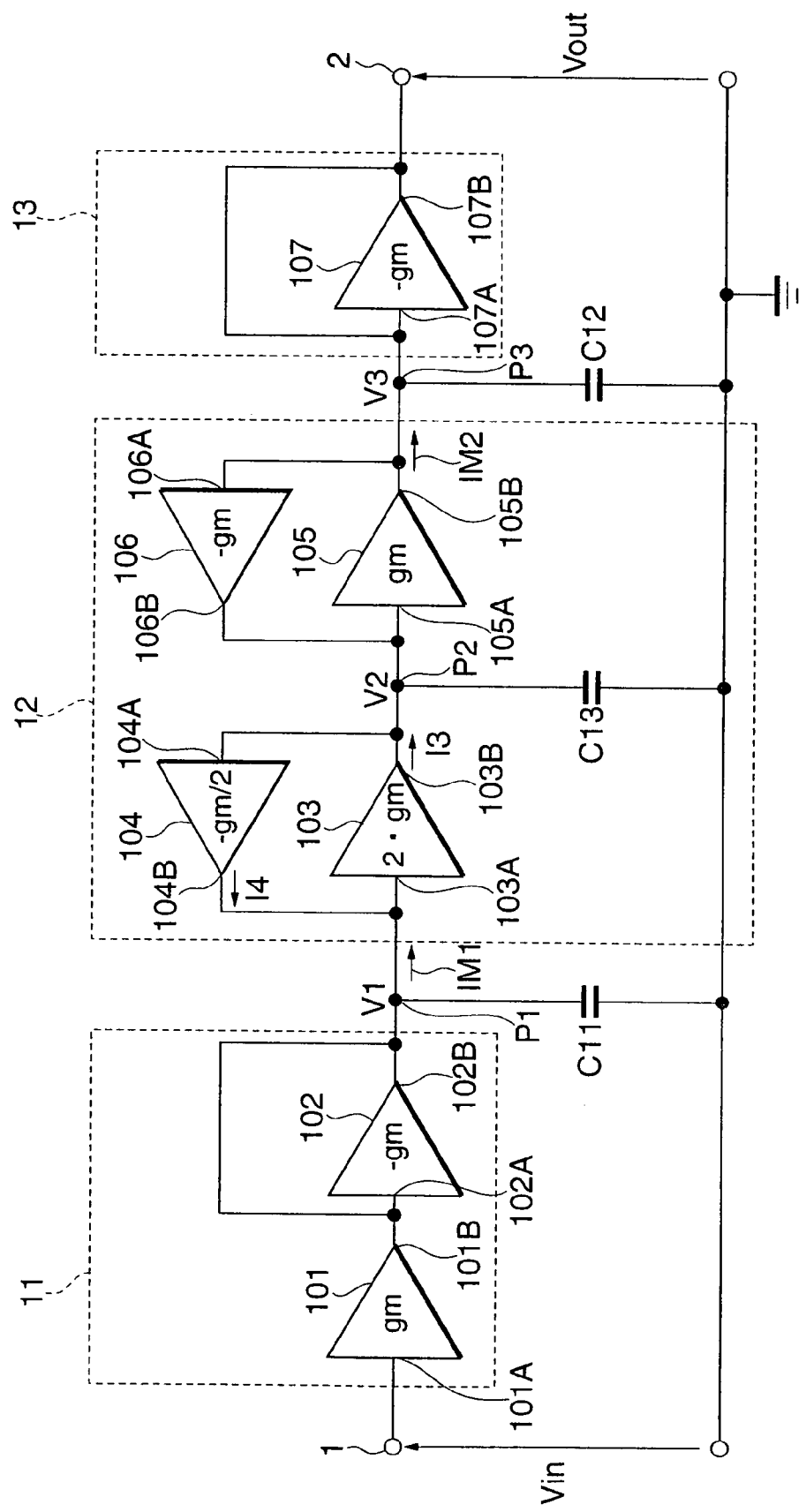
FIG. 1 is a circuit diagram according to the first embodiment.

FIG. 1 shows a construction of the filter circuit in the embodiment.

In FIG. 1, the filter circuit comprises: an input terminal 1; an output terminal 2; an input terminating portion 11; an inductor portion 12; an output terminating portion 13; and contacts P1 to P3.

Voltage controlled current sources (that is, transconductance amplifiers) 101 to 107 constructing the respective portions 11 to 13 are provided in the filter circuit. Mutual conductances of the voltage controlled current sources 101 to 107 are set as follows. That is, the sources 101 and 105 are set to gm, the sources 102, 106, and 107 are set to −gm, the source 103 is set to 2×gm, and the source 104 is set to −gm/2, respectively. Each of the voltage controlled current sources 101 to 107 is a transconductance amplifier of a 1-input 1-output type having one input terminal and one output terminal.

As a method of changing the mutual conductance from the reference value gm by increasing it to the value that is two times or ½ time as large as the reference value or the like as mentioned above, there is a method of changing a channel width of a bipolar type transistor Tr or an FET (Field Effect Transistor) or a method of using an adjusting terminal 67A (refer to FIG. 13), which will be explained hereinlater.

For example, when the channel width is doubled, the mutual conductance gm is doubled. When a current amount of a variable current source 67 is doubled by a control signal (bias value) which is supplied to the adjusting terminal 67A, the mutual conductance gm is doubled.

Reference characters are added to input terminals and output terminals of the voltage controlled current sources 101 to 107 in accordance with a rule such that "A" is added to each input terminal and "B" is added to each output terminal. For example, the input terminal of the voltage controlled current source 101 is designated by 101A and its output terminal is designated by 101B.

Figure 13:
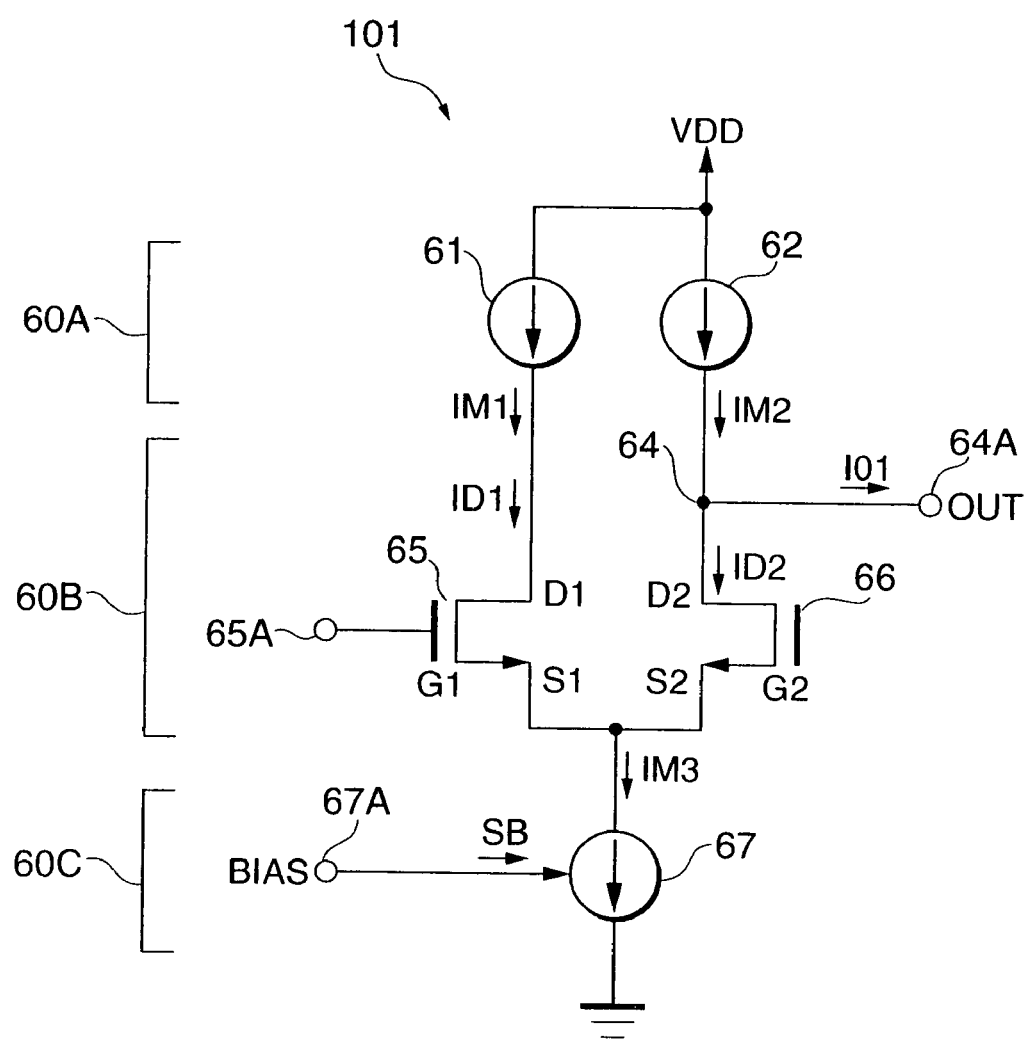
FIG. 13 is a schematic diagram showing an example of an internal construction of the voltage controlled current source.

FIG. 13 shows an internal construction of each of the voltage controlled current sources 101 to 107. Since the internal constructions of the voltage controlled current sources 101 to 107 are substantially the same, explanation will be made on the assumption that the voltage controlled current source 101 is shown in FIG. 13.

(A-1-1) Internal Construction of the Voltage Controlled Current Source

The voltage controlled current source 101 is constructed by: a current source portion 60A comprising current sources 61 and 62; a differential amplifier 60B mainly comprising FETs 65 and 66; and a control portion 60C for controlling the mutual conductance gm of the voltage controlled current source 101 by a control signal (control current or control voltage) which is supplied to the adjusting terminal 67A.

Specifically speaking, the current sources 61 and 62 can be constructed by, for example, pnp-type transistors whose characteristics are equal and whose base-emitter voltages VBE are equal. In this case, a current IM1 which is supplied from the current source 61 and a current IM2 which is supplied from the current source 62 correspond to a collector current Ic of the pnp-type transistor.

If necessary, the current source 61 (or 62) is not limited to the single transistor but can have a high precision current mirror construction using a plurality of transistors or diodes.

In any case, a current value of the current IM1 which is ouputted from the current source 61 and a current value of the current IM2 which is outputted from the current source 62 have to be equal.

A drain D1 of the FET 65 is connected to the current source 61 and a drain D2 of the FET 66 is connected to the current source 62 through a node 64. An output terminal 64A connected to the node 64 corresponds to the output terminal 101B.

An input terminal 65A is connected to a gate G1 of the FET 65 and the input terminal 65A corresponds to the input terminal 101A.

Further, sources S1 and S2 of the two FETs 65 and 66 are connected to the variable current source 67. A current value of a current IM3 of the variable current source 67 can be changed by a control signal SB which is supplied to the adjusting terminal 67A.

The FETs 65 and 66 are constructed by FETs having similar, that is, substantially the same characteristics.

As mentioned above, since the gate (G1) of the FET is connected to the input terminals (101A, etc.) of the voltage controlled current sources 101 to 107, the current is hardly inputted but only the voltage is substantially supplied.

For example, when a value of a drain current ID1 is increased by such a voltage, a value of a drain current ID2 of the FET 66 which is given by a difference (IM3−ID1) between the currents ID1 and IM3 decreases. Thus, a value of a current ID1 which is outputted from the output terminal 64A increases and a voltage (drain-source voltage VDS of the FET 66) which is outputted from the output terminal 64A decreases. When the value of ID1 is decreased by such a voltage, each portion executes the operation opposite to that mentioned above.

As mentioned above, by using the adjusting terminal 67A, each of the voltage controlled current sources 101 to 107 can be adjusted in correspondence to a temperature fluctuation or a variation in device values. By this adjustment, desired gm characteristics can be given to each of the voltage controlled current sources 101 to 107.

In the filter circuit in FIG. 1 having the seven voltage controlled current sources 101 to 107 as mentioned above, the input terminal 1 is connected to the input 101A of the voltage controlled current source 101. The output 101B of the voltage controlled current source 101 is connected to an input 102A and an output 102B of the voltage controlled current source 102, one electrode of a capacitor C11, an input 103A of the voltage controlled current source 103, and an output 104B of the voltage controlled current source 104, respectively.

An output 103B of the voltage controlled current source 103 is connected to an input 104A of the voltage controlled current source 104, one electrode of a capacitor C13, an input 105A of the voltage controlled current source 105, and an output 106B of the voltage controlled current source 106, respectively.

Further, an output 105B of the voltage controlled current source 105 is connected to an input 106A of the voltage controlled current source 106, one electrode of a capacitor C12, an input 107A and an output 107B of the voltage controlled current source 107, and the output terminal 2, respectively.

Points where one electrode of each of the capacitors C11 to C13 is connected to the input terminal and output terminal of the voltage controlled current source (102, etc.) correspond to the contacts P1 to P3, respectively.

The other electrodes (electrodes on the side opposite to the contacts P1 to P3) of the connected capacitors C11, C12, and C13 are connected to the ground, respectively.

Figure 7:
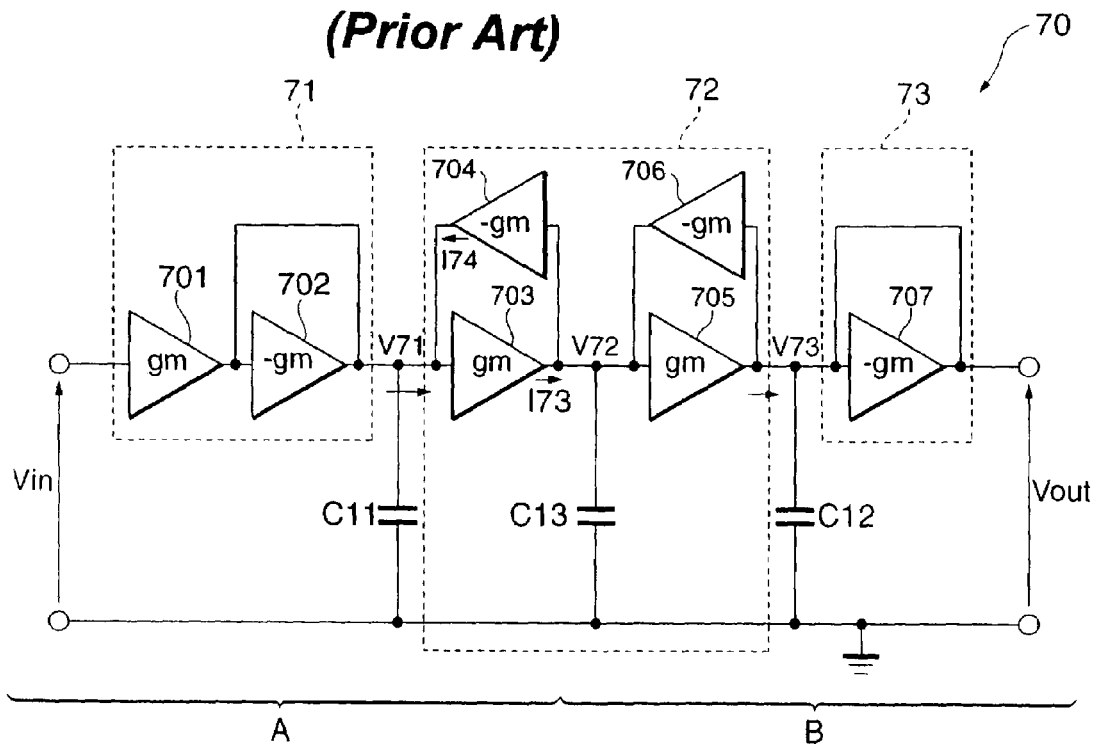
FIG. 7 is a circuit diagram showing an equivalent circuit of the circuit of FIG. 5.
Figure 8:
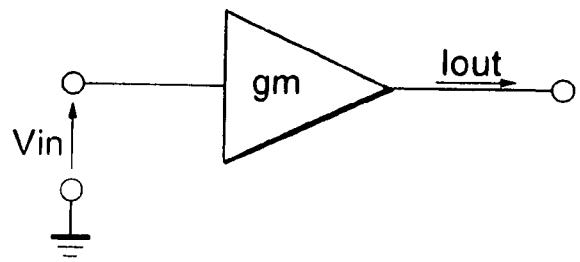
FIG. 8 is a circuit diagram regarding the voltage controlled current source.
Figure 9:
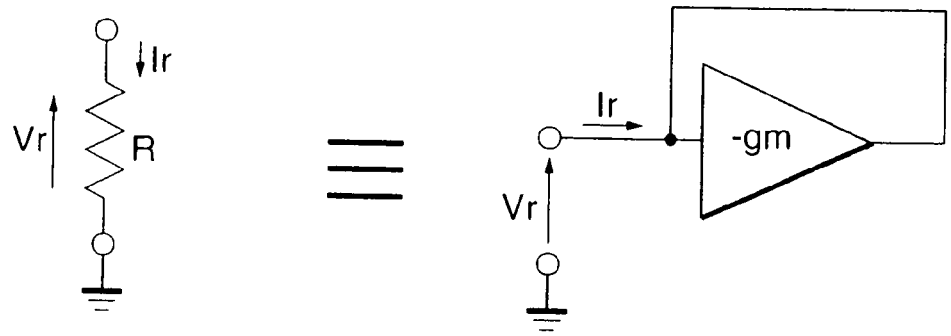
FIG. 9 is a circuit diagram regarding the voltage controlled current source.
Figure 10:
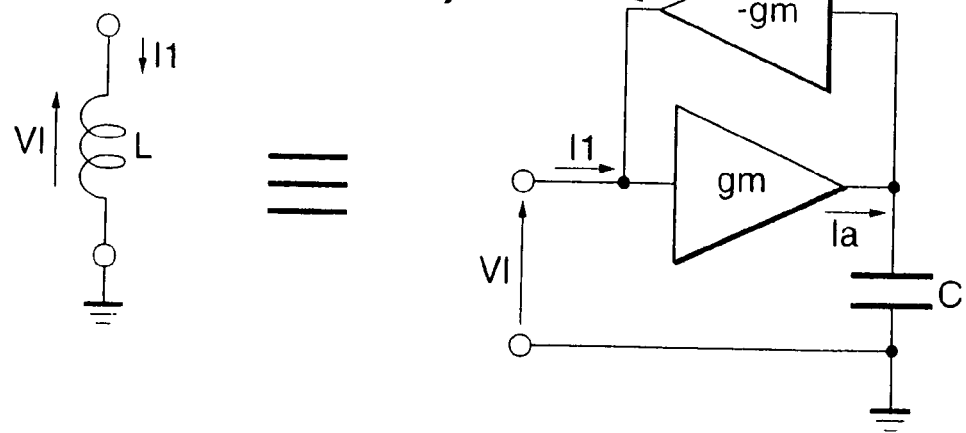
FIG. 10 is a circuit diagram regarding the voltage controlled current source.
Figure 11:
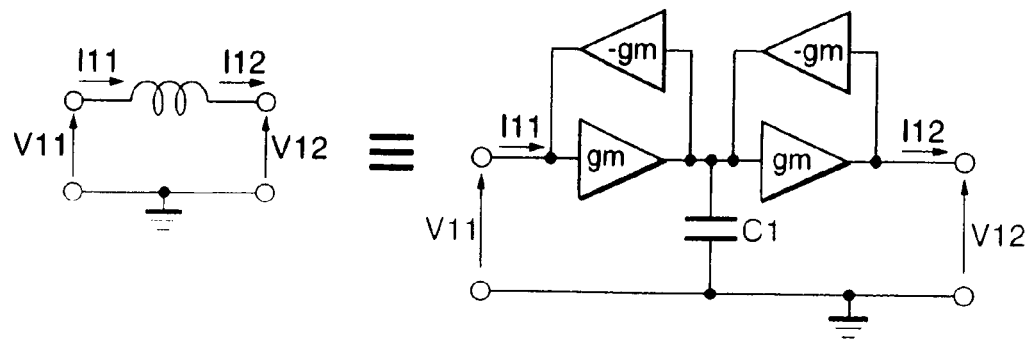
FIG. 11 is a circuit diagram regarding the voltage controlled current source.

A difference of the construction from the filter circuit 70 shown in FIG. 7 mentioned above is concerned with only the values of the mutual conductances which the two voltage controlled current sources 103 and 104 in the inductor portion 12 have.

The operation of the embodiment having the construction as mentioned above will now be described hereinbelow.

(A-2) Operation of the First Embodiment

The operation of the filter circuit in the embodiment will be described in comparison with that of the filter circuit 70 having a gain "1".

Since the mutual conductance (2×gm) of the voltage controlled current source 103 is twice as large as a mutual conductance (gm) which a voltage controlled current source 703 has, an output current I3 of the voltage controlled current source 103 is twice as large as an output current I73 of the voltage controlled current source 703.

Since the capacitor C13 in the embodiment has the same capacitance as that in FIG. 7, an internal voltage V2 of the inductor portion 12 is twice as large as an internal voltage V72 of the inductor portion 72 shown in FIG. 7.

Although the mutual conductance (−gm/2) of the voltage controlled current source 104 is equal to ½ of a mutual conductance (−gm) which the voltage controlled current source 704 in FIG. 7 has, since the value of V2 is twice as large as the value of V72, an output current I4 of the voltage controlled current source 104 is equal to an output current I74 of the voltage controlled current source 704.

That is, since the values of the mutual conductances of the voltage controlled current sources 101 and 102 of the input terminating portion 11 and the value of the capacitor C11 are the same as those in FIG. 7, the input voltage V1 of the inductor portion 12 is also equal to an input voltage V71 of the inductor portion 72 in FIG. 7.

From the above description, with respect to the relation between the input voltage and the input current in the inductor portion 12, the equation (3) is satisfied. An apparent value as an inductor in the inductor portion 12 is equal to that in FIG. 7 and it can be regarded that the internal voltage V2 is doubled.

Since the mutual conductances (gm, −gm, −gm) of the voltage controlled current sources 105 to 107 are equal to those of the voltage controlled current sources 705 to 707 in FIG. 7 and the value of the capacitor C12 is also the same, an output voltage V3 of the inductor portion 12 is twice as large as an output voltage V73 which is outputted from the inductor portion 72 in FIG. 7, and a voltage Vout which is outputted from the output terminal 2 is twice as large as the voltage Vin which is inputted from the input terminal 1.

When output noises of the voltage controlled current source whose mutual conductance is equal to gm are assumed to be Ni, output noises of the voltage controlled current source 103 are equal to Ni/2 and output noises of the voltage controlled current source 104 are equal to 2×Ni from the equation (4). Output noises N1 in the filter circuit are as follows.

$$N1 = \sqrt{(5 \times Ni^2 + (Ni/2)^2 + (2 \times Ni)^2)} \quad (6)$$
$$= \sqrt{(9.25 \times Ni^2)}$$
$$= 3.04 \times Ni$$

When comparing values of the equations (5) and (6), the output noises of the filter circuit in the embodiment are slightly larger than those of the filter circuit 70 having no gain in FIG. 7. However, when comparing input conversion noises, since the gain of the filter circuit is twice as large as that of the filter circuit 70, the input conversion noises are equal to 1.52×Ni from the equation (6) and are fairly smaller than those of the filter circuit 70 having no gain.

The input conversion noises generally denote a value obtained by dividing a noise voltage appearing in an output of an amplifier by an amplification factor of the amplifier.

(A-3) Effects of the First Embodiment

According to the embodiment as mentioned above, the mutual conductance which one voltage controlled current source (103) has is merely set to a value that is twice as large as a value which will be set so as to give a gain "1" to the filter circuit and the value of the mutual conductance which one voltage controlled current source (104) has is also merely set to ½ of the value which will be likewise set so as to give a gain "1" to the filter circuit, so that the input signal is allowed to have the double voltage gain without changing the characteristics of the filter and can be outputted.

Thus, the input conversion noises can be reduced and the filter performance can be improved.

(B) Second Embodiment

Only different points between the first and second embodiments will now be described hereinbelow.

The second embodiment will be also explained with respect to a filter circuit of the LC ladder type of the ternary π type as an example.

(B-1) Construction of the Second Embodiment

Figure 2:
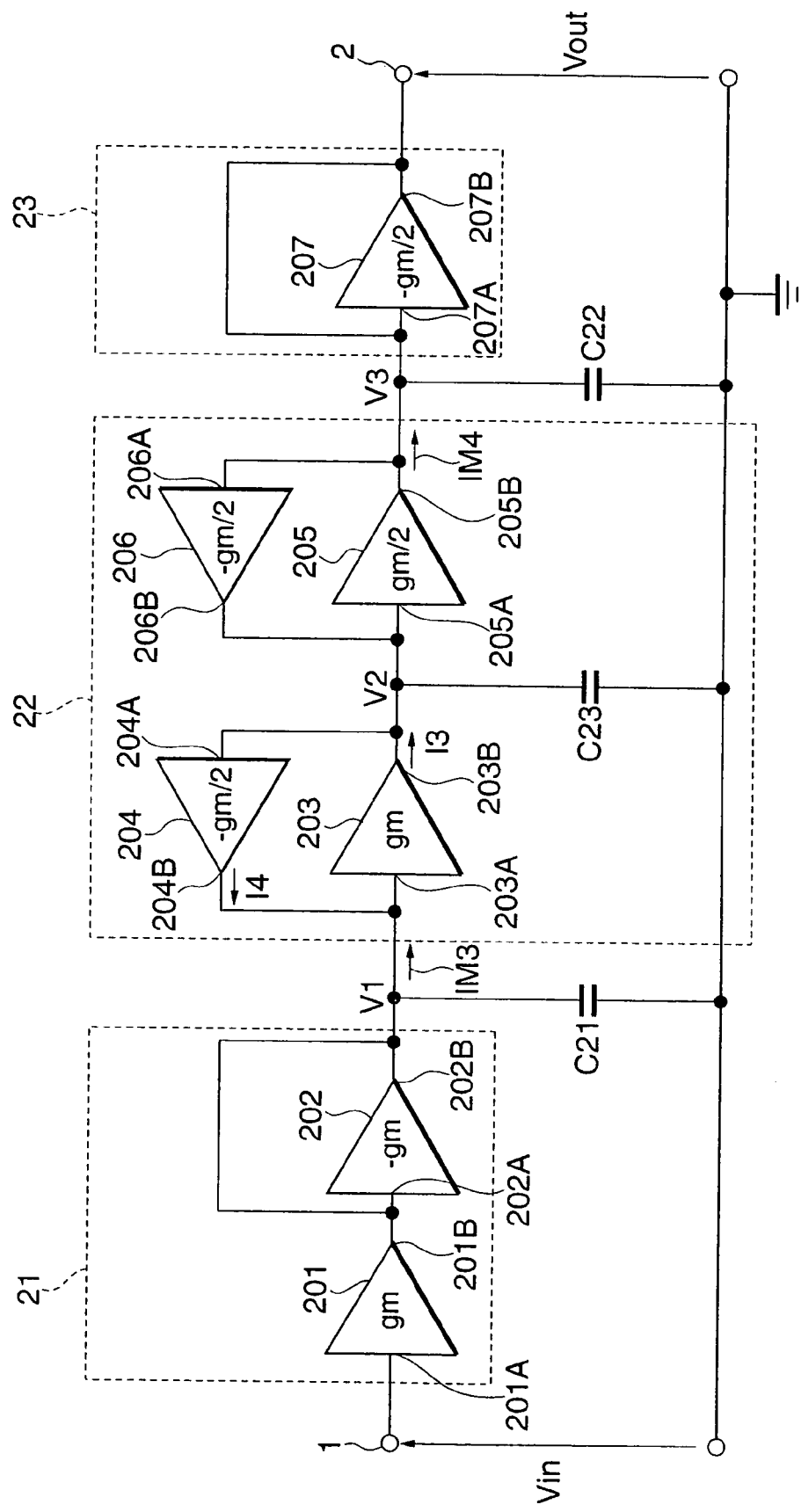
FIG. 2 is a circuit diagram according to the second embodiment.

FIG. 2 shows the filter circuit of the second embodiment.

In FIG. 2, the filter circuit has the input terminal 1, the output terminal 2, an input terminating portion 21, an inductor portion 22, and an output terminating portion 23.

Voltage controlled current sources 201 to 207 constructing the portions 21 to 23 are provided in the filter circuit. Mutual conductances of the voltage controlled current sources 201 to 207 are set as follows. That is, the current sources 201 and 203 are set to gm, the current source 202 is set to –gm, the current source 205 is set to gm/2, and the current sources 204, 206, and 207 are set to –gm/2, respectively.

The input terminal 1 is connected to an input 201A of the voltage controlled current source 201. An output 201B of the voltage controlled current source 201 is connected to an input 202A and an output 202B of the voltage controlled current source 202, one electrode of the capacitor C11, an input 203A of the voltage controlled current source 203, and an output 204B of the voltage controlled current source 204, respectively.

An output 203B of the voltage controlled current source 203 is connected to an input 204A of the voltage controlled current source 204, one electrode of a capacitor C23, an input 205A of the voltage controlled current source 205, and an output 206B of the voltage controlled current source 206, respectively.

An output 205B of the voltage controlled current source 205 is connected to an input 206A of the voltage controlled current source 206, one electrode of a capacitor C22, an input 207A and an output 207B of the voltage controlled current source 207, and the output terminal 2, respectively.

The other electrodes of the capacitors C11, C22, and C23 are connected to the ground, respectively.

A difference between the construction of the filter circuit and that of the filter circuit 70 having a gain "1" shown in FIG. 7 relates to only values of mutual conductances of the voltage controlled current sources 204 to 207 and values of the capacitors C22 and C23. Connecting methods of the devices are substantially the same. Each of the capacitance values of the capacitors C22 and C23 of the filter circuit according to the invention shown in FIG. 2 is equal to ½ of that of each of the capacitors C12 and C13 of the filter circuit 70.

The operation of the embodiment having a construction as mentioned above will now be described hereinbelow.

(B-2) Operation of the Second Embodiment

In a manner similar to the case of the first embodiment, the operation of the filter circuit in the second embodiment will now be described in comparison with that of the filter circuit 70 in FIG. 7.

Since the mutual conductance of the voltage controlled current source 203 is the same as that of the voltage controlled current source 703 in FIG. 7, the output current I3 of the voltage controlled current source 203 is equal to the output current I73 of the voltage controlled current source 703. However, since a capacitance value of the capacitor C23 is equal to ½ of that of the capacitor C13, the internal voltage V2 of the inductor portion 22 is twice as large as the internal voltage V72 of the inductor portion 72 shown in FIG. 7.

Although the mutual conductance (–gm/2) of the voltage controlled current source 204 is equal to ½ of the mutual conductance (–gm) which the voltage controlled current source 704 in FIG. 7 has, since the value of V2 is twice as large as that of V72, the output current I4 of the voltage controlled current source 204 is equal to the output current I74 of the voltage controlled current source 704.

That is, since the values of the mutual conductances (gm, –gm) of the voltage controlled current sources 201 and 202 of the input terminating portion 21 and the value of the capacitor C11 are equal to those of the filter circuit 70 showing the gain "1" in FIG. 7, the input voltage V1 of the inductor portion 22 is also equal to the input voltage V72 of the inductor portion 72 shown in FIG. 7.

From the above explanation, with respect to the relation between the input voltage and the input current in the inductor portion 22, the equation (3) is satisfied. It can be regarded that the apparent value as an inductor in the inductor portion 22 is equal to that in FIG. 7 and doubles the internal voltage V2.

The mutual conductance of each of the voltage controlled current sources 205 to 207 is equal to ½ of the mutual conductance which each of the voltage controlled current sources 705 to 707 shown in FIG. 7 has. However, since the value of the capacitor C22 is also equal to ½ of that of the capacitor C12, an electric potential at the contact P3 is equal to that at the contact P2. The output voltage V3 of the inductor portion 22 is twice as large as the output voltage V73 of the inductor portion 72 shown in FIG. 7. The voltage Vout which is outputted from the output terminal 2 is twice as large as the voltage Vin which is inputted from the input terminal 1.

The output noises N2 in the filter circuit of the embodiment when the output noises of the voltage controlled current source whose mutual conductance is equal to gm are assumed to be Ni are as follows from the equation (4).

$$N2 = \sqrt{(3 \times Ni^2 + 4 \times (2 \times Ni)^2)} \quad (7)$$
$$= \sqrt{(19 \times Ni^2)}$$
$$= 4.36 \times Ni$$

When comparing values of the equations (5) and (7), the output noises of the filter circuit of the embodiment are larger than those of the filter circuit 70 having no gain in FIG. 7. However, when comparing the input conversion noises, since the gain in the filter circuit is twice as large as the gain of the filter circuit 70, the input conversion noises are equal to 2.18×Ni from the equation (7) and are fairly smaller than those of the filter circuit 70 having no gain.

(B-3) Effects of the Second Embodiment

According to the embodiment as mentioned above, the values of the mutual conductances which the four voltage controlled current sources (204 to 207) have are merely set to ½ and the values of the two capacitors are merely set to ½, so that the input signal is allowed to have the double voltage gain without changing the characteristics of the filter and can be outputted.

By setting the value of the mutual conductance of each of the voltage controlled current sources 205, 206, and 207 into the half value and by setting the value of C22 into the half value, the current consumption in each of them can be reduced without causing a change in filter characteristics. Thus, the input conversion noises can be reduced and the filter performance can be improved.

(C) Third Embodiment

Only different points between the first embodiment and the third embodiment will be described hereinbelow.

Although the first embodiment has been described with respect to the filter circuit of the LC ladder type of the ternary π type, the third embodiment relates to a low pass filter circuit of the resistance both-terminating LC ladder type of the quinary π type.

(C-1) Construction of the Third Embodiment

Figure 3:
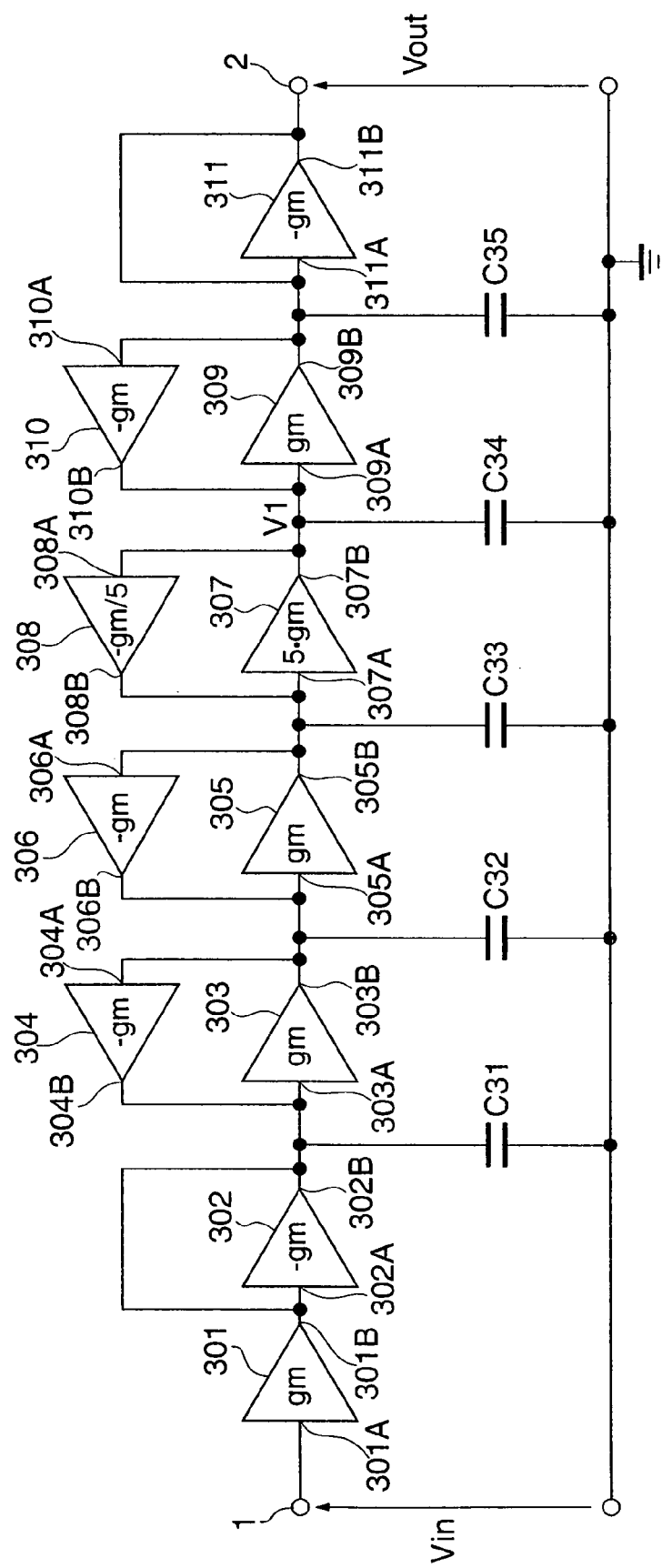
FIG. 3 is a circuit diagram according to the third embodiment.

FIG. 3 shows the filter circuit of the third embodiment.

In FIG. 3, the filter circuit has the input terminal 1, the output terminal 2, eleven voltage controlled current sources 301 to 311, and five capacitors C31 to C35.

Mutual conductances of the voltage controlled current sources 301 to 311 are set as follows. That is, the current sources 301, 303, 305, and 309 are set to gm, the current sources 302, 304, 306, 310, and 311 are set to −gm, the current source 307 is set to 5≅gm, and the current source 308 is set to −gm/5, respectively.

The input terminal 1 is connected to an input 301A of the voltage controlled current source 301. An output 301B of the voltage controlled current source 301 is connected to an input 302A and an output 302B of the voltage controlled current source 302, one electrode of the capacitor C31, an input 303A of the voltage controlled current source 303, and an output 304B of the voltage controlled current source 304, respectively.

An output 303B of the voltage controlled current source 303 is connected to an input 304A of the voltage controlled current source 304, one electrode of the capacitor C32, an input 305A of the voltage controlled current source 305, and an output 306B of the voltage controlled current source 306, respectively.

An output 305B of the voltage controlled current source 305 is connected to an input 306A of the voltage controlled current source 306, one electrode of the capacitor C33, an input 307A of the voltage controlled current source 307, and an output 308B of the voltage controlled current source 308, respectively.

An output 307B of the voltage controlled current source 307 is connected to an input 308A of the voltage controlled current source 308, one electrode of the capacitor C34, an input 309A of the voltage controlled current source 309, and an output 310B of the voltage controlled current source 310, respectively.

An output 309B of the voltage controlled current source 309 is connected to an input 310A of the voltage controlled current source 310, one electrode of the capacitor C35, an input 311A and an output 311B of the voltage controlled current source 311, and the output terminal 2, respectively.

The other electrodes of the capacitors C31 to C35 are connected to the ground, respectively.

The operation of the embodiment having the construction as mentioned above will now be described hereinbelow.

(C-2) Operation of the Third Embodiment

Figure 4:
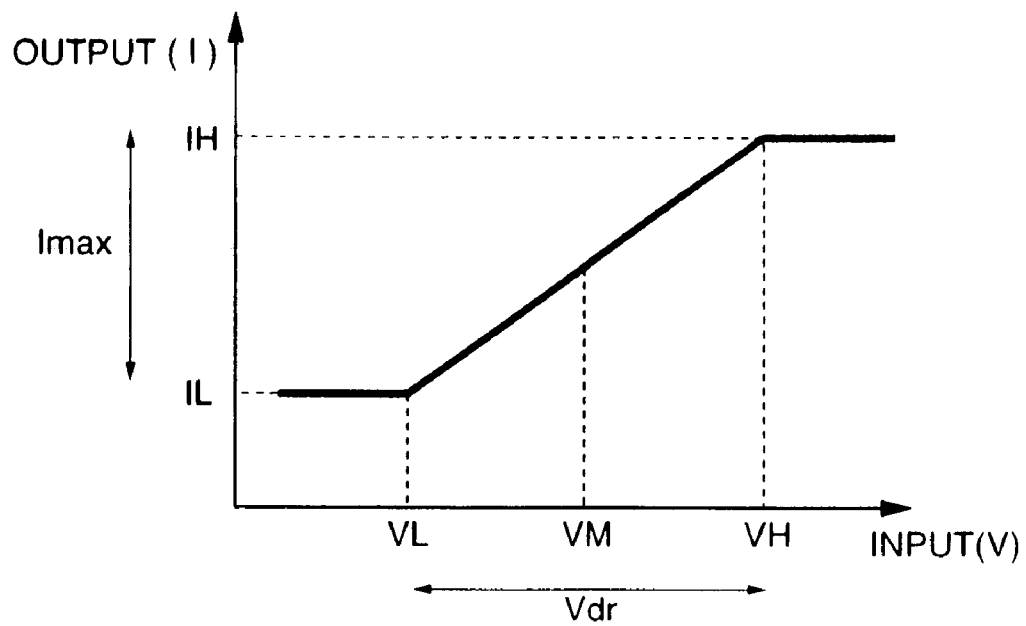
FIG. 4 is an explanatory diagram of the operation of a voltage controlled current source.
Figure 5:
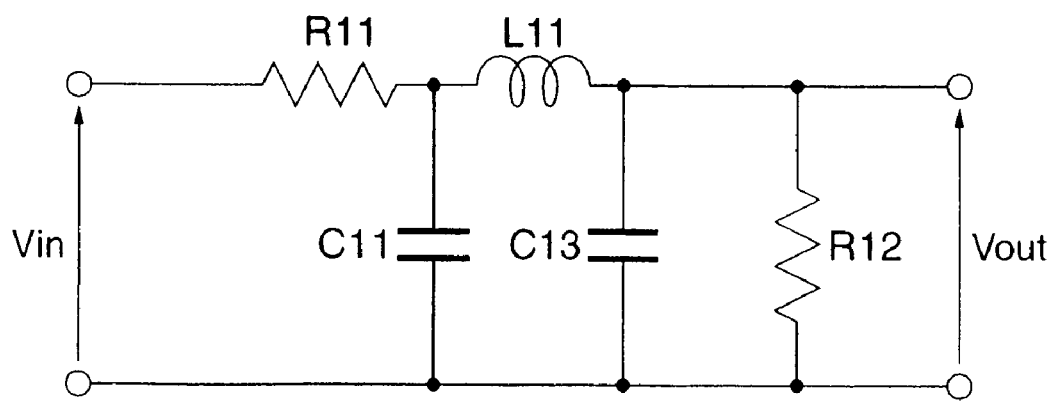
FIG. 5 is a circuit diagram showing an LC ladder type filter circuit of a resistance both-terminating type.
Figure 6:
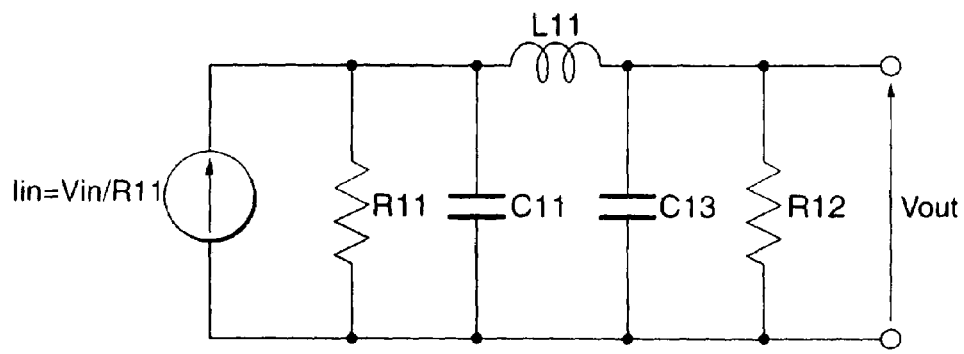
FIG. 6 is a circuit diagram showing an equivalent circuit of the circuit of FIG. 5.

FIG. 4 shows input and output characteristics of the voltage controlled current source.

Although an input dynamic range is not restricted in case of passive devices such as resistor, inductor, and the like, a voltage controlled current source mainly comprising transistors has an input dynamic range which has been predetermined by a power voltage, a bias current, and the like. In FIG. 4, if a voltage amplitude of an input signal to the voltage controlled current source lies within a range (input dynamic range: Vdr) of VL to VH, the voltage controlled current source linearly operates and the equation (1) is satisfied. Therefore, the input voltage is proportionally converted into the current and outputted.

Therefore, generally, the input signal around an intermediate electric potential VM between VL and VH as a center is inputted. If the signal of a voltage amplitude exceeding the input dynamic range is inputted to the voltage controlled current source, the voltage controlled current source operates in a non-linear region. The input voltage is not proportionally converted into the current but is limited to a certain current amplitude Imax.

By paying attention to such a point, in the filter circuit of the embodiment, the values of the mutual conductances which the two voltage controlled current sources have constructing a certain loop are set in a manner such that when the voltage Vin is inputted from the input terminal 1, each voltage controlled current source which is located on the input terminal side than a certain contact always linearly operates. The voltage at this contact is amplified to a voltage over the input dynamic range of the voltage controlled current source, and each voltage controlled current source which is located on the output terminal side from such a contact non-linearly operates.

That is, the voltage is actively amplified so as to exceed the input dynamic range of the voltage controlled current source which is connected after such a contact. In the embodiment, a voltage at this contact is assumed to be V1 and the mutual conductances which the two voltage controlled current sources 307 and 308 have are set to 5 times and ⅕ time, respectively.

Thus, the voltage Vout which is outputted from the output terminal 2 of the filter circuit in the embodiment becomes an amplitude limited voltage like a pulse signal.

That is, according to the filter circuit, since unnecessary frequencies are cut off in the former half portion of the circuit and the output signal is amplitude limited in the latter half portion and outputted, the filter circuit has not only the function as a simple filter circuit but also the function as a limiter circuit, so that multifunction of the analog filter can be realized.

However, as an input signal to the filter circuit, only a signal which does not have a meaning in the voltage direction, for example, only a frequency modulated or phase modulated signal can be used.

(C-3) Effects of the Third Embodiment

In the general filter circuit, it is necessary to keep an input dynamic range as wide as possible in order to allow all of the voltage controlled current sources constructed in the filter circuit to linearly operate. However, such a process is unnecessary according to the filter circuit of the third embodiment.

Since there is also no need to keep a wide input dynamic range of each voltage controlled current source, bias currents which are inputted thereto are also suppressed to small currents.

Further, in the embodiment, the input conversion noises are smaller than those of the filter circuit 70 and multifunction can be realized.

(D) Fourth Embodiment

Only different points between the first and second embodiments and the fourth embodiment will now be described hereinbelow.

The fourth embodiment relates to a modification of the filter circuit 70.

(D-1) Construction and Operation of the Fourth Embodiment

Figure 12:
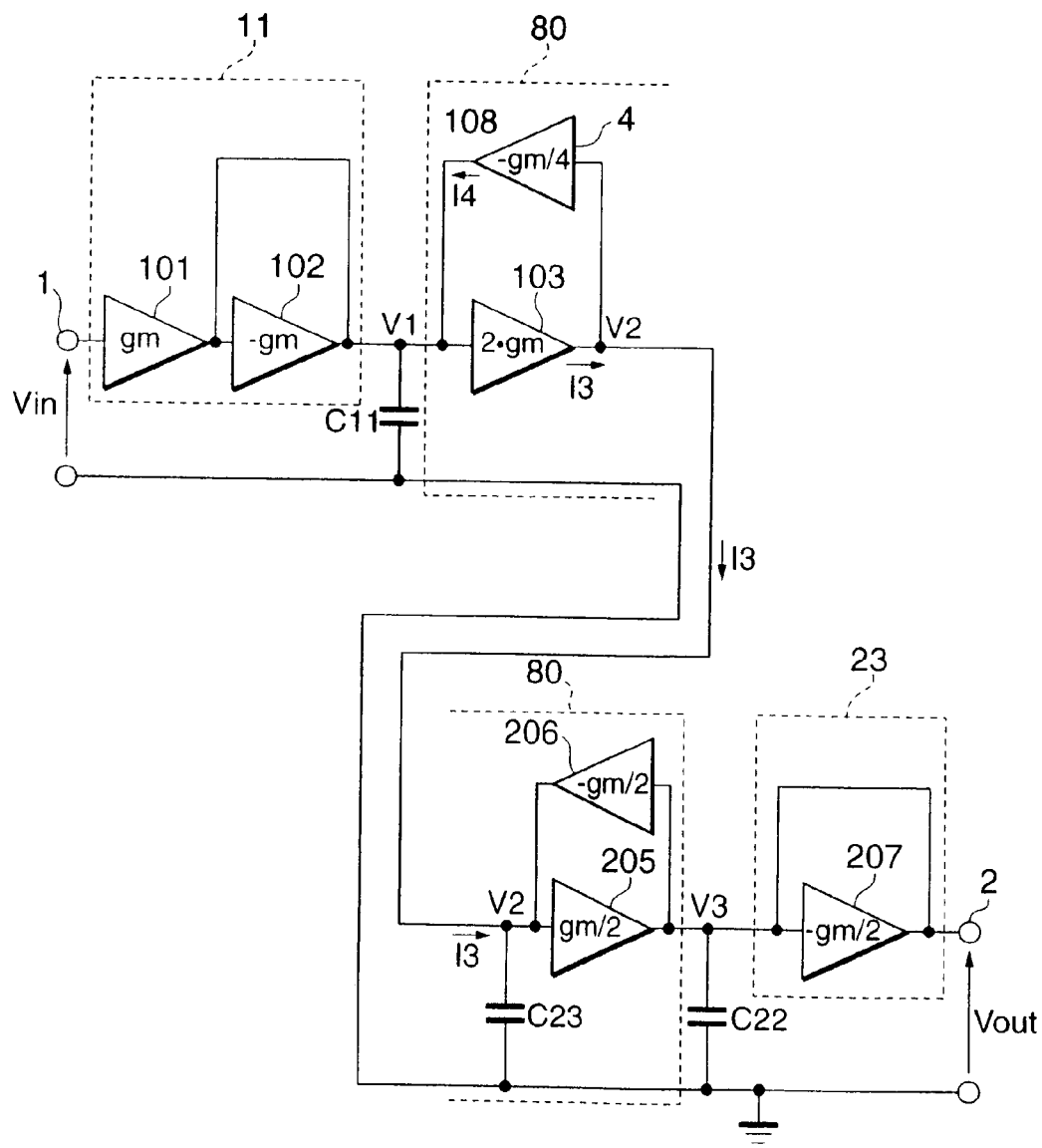
FIG. 12 is a circuit diagram according to the fourth embodiment.

FIG. 12 shows a filter circuit in the fourth embodiment.

In FIG. 12, the filter circuit has the input terminal 1, the output terminal 2, the input terminating portion 11, an intermediate circuit portion 80, and the output terminating portion 23.

Among them, the functions of the component elements designated by the same reference numerals as 1, 2, 11, and 23 in the first and second embodiments are substantially the same as those of the corresponding component elements in the first and second embodiments.

Therefore, the fourth embodiment is characterized by the intermediate circuit portion 80.

The intermediate circuit portion 80 has the voltage controlled current sources 103, 108, 205, and 206 and the capacitor C23.

Among them, a loop comprising the voltage controlled current sources 103 and 108 and the portion of the input terminating portion 11 correspond to a portion A (portion comprising the input terminating portion 71 and voltage controlled current sources 703 and 704) of the filter circuit 70 mentioned above and are component elements for setting the internal voltage V2 to a value that is twice as large as that of the filter circuit 70.

A loop comprising the voltage controlled current sources 205 and 206 and the portion of the output terminating portion 23 correspond to a portion B (portion comprising the output terminating portion 73, voltage controlled current sources 705 and 706, and capacitor C12) of the filter circuit 70 mentioned above and are component elements for setting the internal voltage V2 to a value that is twice as large as that of the filter circuit 70.

The value of the capacitor C23 is the same as that of the capacitor C23 shown in FIG. 2.

By such a construction as mentioned above, in the filter circuit of the embodiment, the voltage Vout which is outputted from the output terminal 2 is set to a value that is 4 times as large as the voltage Vin which is inputted from the input terminal 1.

(D-2) Effects of the Fourth Embodiment

According to the fourth embodiment, it is possible to allow the input signal to have the voltage gain of 4 times.

Thus, the input conversion noises can be reduced and the filter performance can be improved.

(F) Other Embodiments

The first embodiment has been described with respect to the filter circuit such that the mutual conductances of the two voltage controlled current sources constructing the loop at the frontmost stage of the inductor portion 12 are set to 2 times and ½ time, thereby allowing the input signal to have the double voltage gain and outputting it. However, if the mutual conductances of the two voltage controlled current sources constructing the loop or two voltage controlled current sources constructing another loop are set to M times and 1/M time, respectively, the voltage gain of M times can be obtained. The larger the voltage gain is, the smaller the input conversion noises are. However, M is assumed to be a positive real number over 1 (excluding 1).

The first embodiment has been described with respect to the filter circuit such that by changing the mutual conductances of the two voltage controlled current sources constructing one certain loop in the inductor portion 12, the input signal is allowed to have a voltage gain and outputted. However, if mutual conductances of the voltage controlled current sources constructing a plurality of loops are set to M times, 1/M time, subsequently, N times, 1/N time, . . . , a voltage gain of (M×N× . . . ) times can be obtained. The larger the voltage gain is, the smaller the input conversion noises are. Where, it is assumed that M, N, . . . are positive real numbers excluding 1 and their product (M×N× . . . ) is a positive real number over 1 (excluding 1).

The second embodiment has been described with respect to the filter circuit such that the mutual conductances of the four voltage controlled current sources and the values of the two capacitors are set to ½ time, thereby allowing the input signal to have the double voltage gain and outputting it. However, by setting them into 1/k time, the voltage gain of k times is obtained. The larger the voltage gain is, the smaller the input conversion noises are. Where, k is assumed to be a positive real number over 1 (excluding 1).

The second embodiment has been described with respect to the construction such that the voltage after V2 in the inductor portion 22 is doubled. However, a similar effect can be also derived even if the voltage after VI as an input voltage to the inductor portion 22 or the voltage after V3 as an output from the inductor portion 22 is doubled.

The third embodiment has been described with respect to the filter circuit such that the mutual conductances of the two voltage controlled current sources 307 and 308 constructing the loop are set to 5 times and ⅕ time, thereby amplitude limiting the input signal and outputting it. However, if the circuit is allowed to linearly operate in the former half portion than the contact which is allowed to have the gain and the circuit is allowed to non-linearly operate in the latter half portion, a similar effect can be derived even if the mutual conductances of those two voltage controlled current sources 307 and 308 constructing the loop or those of two voltage controlled current sources 307 and 308 constructing another loop are set to t times and 1/t time. Where, t is assumed to be a positive real number of 1 or more.

The third embodiment has been described with respect to the filter circuit such that the construction of the filter circuit in the first embodiment is used as a basic construction and the input signal is amplified at a certain contact. However, a similar effect can be derived even by using a construction such that the construction of the filter circuit in the second embodiment is used as a basic construction and the input signal is amplified at a certain contact.

According to the first embodiment, since the current IM2 itself which is outputted from the inductor portion 12 is set to the value that is twice as large as the input current IM1, even if the value of the capacitor (C12) or the like locating at the post stage of the inductor portion 12 is maintained as it is, the final output voltage (Vout) of the filter circuit can be doubled. However, in case of the second embodiment, since the current IM4 itself which is outputted from the inductor portion 22 is set to the same value as that of the input current IM3, if the value of the capacitor (C22) or the like locating at the post stage of the inductor portion 22 is not changed in dependence on the amplification factor (for example, 2 times), the final output voltage (Vout) of the filter circuit cannot be doubled.

Therefore, when the element circuit is inserted between the inductor portion 12 (or 22) and the output terminating portion 13 (or 23), according to the filter circuit corresponding to the first embodiment, the characteristics of the circuit arrangement can be independently set. However, according to the filter circuit corresponding to the second embodiment, it is necessary to set the characteristics of the circuit arrangement in accordance with the amplification factor of the inductor portion 22.

The first and second embodiments have been described with respect to the filter circuits of the LC ladder type of the ternary π type. However, a similar effect can be derived even in case of using LC ladder type filter circuits of the π type or T type of an arbitrary degree so long as the filter circuit includes an inductor.

Although the third embodiment has been described with respect to the LC ladder type filter circuit of the quinary π type, a similar effect can be derived even in case of using LC ladder type filter circuits of the π type or T type of an arbitrary degree so long as the filter circuit includes an inductor.

Further, although the first, second, and third embodiments have been described with respect to the LC ladder type filter circuits, a similar effect can be derived even in case of using other filter circuits of the bicut type, state variable type, and the like.

Although the first, second, and third embodiments have been described with respect to the filter circuits of the type terminating with resistances at both ends, a similar effect can be derived even in case of using other filter circuits such as filter circuit in which only an input terminal resistor is connected and filter circuit in which only an output terminal resistor is connected.

Although the first, second, and third embodiments have been described with respect to the low pass filter circuits, a similar effect can be derived even in case of using other filter circuits such as high pass filter circuit, band pass filter circuit, and the like.

Although the first, second, and third embodiments have been described with respect to the filter circuits constructed by the voltage controlled current sources whose one side is connected to the ground (type in which there is only one input terminal), a similar effect can be derived even in case of using a filter circuit constructed by a voltage controlled current sources of the differential type (type in which there are two input terminals).

Further, although the number of voltage controlled current sources constructing the loop circuit (loop) is equal to 2 in each of the first to fourth embodiments, it can be also set to 3 or more as necessary.

According to the invention as described above, the input conversion noises of the filter circuit are reduced and the filter performance can be improved.

The present invention is not limited to the foregoing embodiments but many modifications and variations are possible within the spirit and scope of the appended claims of the invention.

What is claimed is:

1. A filter circuit, comprising:
   a filter input terminal;
   a filter output terminal;
   an input terminating portion connected to the filter input terminal and a first node, comprising:
   a first voltage controlled current source having an input terminal connected to the filter input terminal and an output terminal, wherein a mutual conductance of the first voltage controlled current source is gm; and
   a second voltage controlled current source having an input terminal connected to the output terminal of the first voltage controlled current source and an output terminal connected to the first node and the input terminal of the second voltage controlled current source, wherein a mutual conductance of the second voltage controlled current source is minus gm;
   an inductor portion connected to the first node and a second node, comprising:
   a third voltage controlled current source having an input terminal connected to the first node and an output terminal connected to a third node, wherein a mutual conductance of the third voltage controlled current source is two times gm;
   a fourth voltage controlled current source having an input terminal connected to the third node and an output terminal connected to the input terminal of the third voltage controlled current source, wherein a mutual conductance of the fourth voltage controlled current source is half of minus gm;
   a fifth voltage controlled current source having an input terminal connected to the third node and an output terminal connected to the second node, wherein a mutual conductance of the fifth voltage controlled current source is gm; and
   a sixth voltage controlled current source having an input terminal connected to the output terminal of the fifth voltage controlled current source and an output terminal connected to the input terminal of the fifth voltage controlled current source, wherein a mutual conductance of the sixth voltage controlled current source is minus gm; and
   an output terminating portion connected to the second node and the filter output terminal, comprising;
   a seventh voltage controlled current source having an input terminal connected to the second node and an output terminal connected to the filter output terminal of the filter circuit and the input terminal of the seventh voltage controlled current source, wherein a mutual conductance of the seventh voltage controlled current source is minus gm.

2. The filter circuit according to claim 1, further comprising:
   a first capacitor connected to the first node and a ground node supplied with a ground voltage;
   a second capacitor connected to the third node and the ground node; and
   a third capacitor connected to the second node and the ground node.

3. The filter circuit according to claim 1,
   wherein each of the voltage controlled current sources comprises
   a first current source being supplied with a supply voltage;
   a second current source being supplied with the supply voltage;
   a third current source connected to a ground node supplied with a ground voltage;
   a first MOSFET connected to the first and the third current sources; and
   a second MOSFET connected to the second and the third current sources.

4. A filter circuit, comprising:
a filter input terminal;
a filter output terminal;
an input terminating portion connected to the filter input terminal and a first node, comprising:
  a first voltage controlled current source having an input terminal connected to the filter input terminal and an output terminal, wherein a mutual conductance of the first voltage controlled current source is gm; and
  a second voltage controlled current source having an input terminal connected to the output terminal of the first voltage controlled current source and an output terminal connected to the first node and the input terminal of the second voltage controlled current source, wherein a mutual conductance of the second voltage controlled current source is minus gm;
an inductor portion connected to the first node and a second node, comprising:
  a third voltage controlled current source having an input terminal connected to the first node and an output terminal connected to a third node, wherein a mutual conductance of the third voltage controlled current source is gm;
  a fourth voltage controlled current source having an input terminal connected to the third node and an output terminal connected to the input terminal of the third voltage controlled current source, wherein a mutual conductance of the fourth voltage controlled current source is half of minus gm;
  a fifth voltage controlled current source having an input terminal connected to the third node and an output terminal connected to the second node, wherein a mutual conductance of the fifth voltage controlled current source is half of gm; and
  a sixth voltage controlled current source having an input terminal connected to the output terminal of the fifth voltage controlled current source and an output terminal connected to the input terminal of the sixth voltage controlled current source, wherein a mutual conductance of the sixth voltage controlled current source is half of minus gm; and
an output terminating portion connected to the second node and the output terminal, comprising;
  a seventh voltage controlled current source having an input terminal connected to the second node and an output terminal connected to the filter output terminal of the filter circuit and the input terminal of the seventh voltage controlled current source, wherein a mutual conductance of the seventh voltage controlled current source is half of minus gm.

5. The filter circuit according to claim 4, further comprising:
a first capacitor connected to the first node and a ground node supplied with a ground voltage;
a second capacitor connected to the third node and the ground node; and
a third capacitor connected to the second node and the ground node.

6. The filter circuit according to claim 4,
wherein each of the voltage controlled current sources comprises:
a first current source that is supplied with a supply voltage;
a second current source that is supplied with the supply voltage;
a third current source connected to a ground node supplied with a ground voltage;
a first MOSFET connected to the first and the third current sources; and
a second MOSFET connected to the second and the third current sources.

7. A filter circuit, comprising:
a filter input terminal;
a filter output terminal;
a first voltage controlled current source having an input terminal connected to the filter input terminal and an output terminal, wherein a mutual conductance of the first voltage controlled current source is gm;
a second voltage controlled current source having an input terminal connected to the output terminal of the first voltage controlled current source and an output terminal connected to a first node and the input terminal of the second voltage controlled current source, wherein a mutual conductance of the second voltage controlled current source is minus gm;
a third voltage controlled current source having an input terminal connected to the first node and an output terminal connected to a second node, wherein a mutual conductance of the third voltage controlled current source is gm;
a fourth voltage controlled current source having an input terminal connected to the output terminal of the third voltage controlled current and an output terminal connected to the input terminal of the third voltage controlled current source, wherein a mutual conductance of the fourth voltage controlled current source is minus gm;
a fifth voltage controlled current source having an input terminal connected to the second node and an output terminal connected to a third node, wherein a mutual conductance of the fifth voltage controlled current source is gm; and
a sixth voltage controlled current source having an input terminal connected to the output terminal of the fifth voltage controlled current and an output terminal connected to the input terminal of the fifth voltage controlled current source, wherein a mutual conductance of the fourth voltage controlled current source is minus gm;
a seventh voltage controlled current source having an input terminal connected to the third node and an output terminal connected to a fourth node, wherein a mutual conductance of the seventh voltage controlled current source is five times of gm;
an eighth voltage controlled current source having an input terminal connected to the output terminal of the seventh voltage controlled current and an output terminal connected to the input terminal of the seventh voltage controlled current source, wherein a mutual conductance of the eighth voltage controlled current source is one fifth of minus gm;
a ninth voltage controlled current source having an input terminal connected to the fourth node and an output terminal connected to a fifth node, wherein a mutual conductance of the seventh voltage controlled current source is gm;
a tenth voltage controlled current source having an input terminal connected to the output terminal of the ninth voltage controlled current and an output terminal connected to the input terminal of the ninth voltage controlled current source, wherein a mutual conductance of the fourth voltage controlled current source is minus gm; and an eleventh voltage controlled current source having an input terminal connected to the fifth node and an output terminal connected to the filter output terminal of the filter circuit and the input terminal of the eleventh voltage controlled current source, wherein a mutual conductance of the seventh voltage controlled current source is minus gm.

8. The filter circuit according to claim 7, further comprising:
   a first capacitor connected to the first node and a ground node supplied with a ground voltage;
   a second capacitor connected to the third node and the ground node; and
   a third capacitor connected to the second node and the ground node.

9. The filter circuit according to claim 7,
   wherein each of the voltage controlled current sources comprises:
   a first current source that is supplied with a supply voltage;
   a second current source that is supplied with the supply voltage:
   a third current source connected to a ground node supplied with a ground voltage;
   a first MOSFET connected to the first and the third current sources; and
   a second MOSFET connected to the second and the third current sources.

* * * * *